(12) United States Patent
Iwatsuka et al.

(10) Patent No.: US 11,735,395 B2
(45) Date of Patent: Aug. 22, 2023

(54) CHARGED PARTICLE BEAM DEVICE AND METHOD OF MEASURING ELECTRICAL NOISE

(71) Applicant: Hitachi High-Tech Corporation, Tokyo (JP)

(72) Inventors: Takayasu Iwatsuka, Tokyo (JP); Tomoyo Sasaki, Tokyo (JP); Wen Li, Tokyo (JP); Ryo Kadoi, Tokyo (JP); Makoto Suzuki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 63 days.

(21) Appl. No.: 17/388,704

(22) Filed: Jul. 29, 2021

(65) Prior Publication Data

US 2022/0037109 A1    Feb. 3, 2022

(30) Foreign Application Priority Data

Jul. 31, 2020    (JP) ................................. 2020-129847

(51) Int. Cl.
*H01J 37/244*    (2006.01)
*G01R 29/26*    (2006.01)
(Continued)

(52) U.S. Cl.
CPC ............ *H01J 37/244* (2013.01); *G01R 29/26* (2013.01); *H01J 37/20* (2013.01); *H01J 37/24* (2013.01)

(58) Field of Classification Search
CPC .......... H01J 37/244; H01J 37/20; H01J 37/24; H01J 2237/0216; H01J 2237/24528;
(Continued)

(56) References Cited

U.S. PATENT DOCUMENTS 5,384,463 A    1/1995    Honjo et al.
5,523,576 A    6/1996    Koike et al.
(Continued)

FOREIGN PATENT DOCUMENTS

JP    H06326009 A    11/1994
JP    H07065760 A    3/1995
(Continued)

OTHER PUBLICATIONS

Asai, et al. (Computer English Translation of Japanese Patent No. J P-1 0-334845), pp. 1-7, 1998.
(Continued)

*Primary Examiner* — David A Vanore
(74) *Attorney, Agent, or Firm* — Miles & Stockbridge, P.C.

(57) ABSTRACT

To provide a technique capable of measuring high-frequency electrical noise in a charged particle beam device. A charged particle beam device 100 includes an electron source 2 for generating an electron beam EB1, a stage 4 for mounting a sample 10, a detector 5 for detecting secondary electrons EB2 emitted from the sample 10, and a control unit 7 electrically connected to the electron source 2, the stage 4, and the detector 5 and can control the electron source 2, the stage 4, and the detector 5. Here, when the sample 10 is mounted on the stage 4, and a specific portion 11 of the sample 10 is continuously irradiated with the electron beam EB1 from the electron source 2, the control unit 7 can calculate a time-series change in irradiation position of the electron beam EB1 based on an amount of the secondary electrons EB2 emitted from the specific portion 11, and can calculate a feature quantity for a shake of the electron beam EB1 based on the time-series change in irradiation position. Further, the feature quantity includes a frequency spectrum.

20 Claims, 14 Drawing Sheets

(51) Int. Cl.
  *H01J 37/24* (2006.01)
  *H01J 37/20* (2006.01)
(58) Field of Classification Search
  CPC ..... H01J 2237/24578; H01J 2237/2806; H01J 2237/2809; H01J 2237/2826; H01J 37/28; H01J 37/222; H01J 2237/221; G01R 29/26
  See application file for complete search history.

(56) References Cited

U.S. PATENT DOCUMENTS

| | | | |
|---|---|---|---|
| 8,565,509 B2 | 10/2013 | Takahashi et al. | |
| 9,129,353 B2 | 9/2015 | Shirai et al. | |
| 10,663,416 B2 | 5/2020 | Fukuda | |
| 10,818,470 B2* | 10/2020 | Ikeda | H01J 37/1477 |
| 10,847,344 B2* | 11/2020 | Murakami | H01J 37/1475 |
| 10,872,745 B2* | 12/2020 | Yamamoto | H01J 37/222 |
| 11,024,485 B2 | 6/2021 | Fujisaki et al. | |
| 2002/0030166 A1* | 3/2002 | Hiroi | H01J 37/244 250/492.3 |
| 2002/0175282 A1* | 11/2002 | Nakazawa | H01J 37/265 250/311 |
| 2005/0253067 A1* | 11/2005 | Kawada | H01J 37/28 250/307 |
| 2006/0023936 A1 | 2/2006 | Fujiwara | |
| 2006/0210143 A1* | 9/2006 | Miyamoto | H01J 37/222 382/145 |
| 2007/0280559 A1 | 12/2007 | Ishitani et al. | |
| 2009/0225326 A1 | 9/2009 | Tsuji et al. | |
| 2015/0332892 A1* | 11/2015 | Mooney | H01J 37/26 250/307 |
| 2016/0284506 A1* | 9/2016 | Ogawa | H01J 37/28 |
| 2017/0345614 A1* | 11/2017 | Kimura | H01J 37/222 |
| 2018/0277377 A1* | 9/2018 | Eto | H01J 37/32009 |
| 2019/0088455 A1* | 3/2019 | Kamaji | G06N 20/10 |
| 2021/0043412 A1* | 2/2021 | Miwa | H01J 37/244 |
| 2021/0064789 A1* | 3/2021 | Vincent | G01R 19/0053 |
| 2021/0066027 A1* | 3/2021 | Mack | G06T 7/42 |
| 2021/0082658 A1* | 3/2021 | Mack | G06T 7/13 |
| 2021/0142977 A1* | 5/2021 | Mack | H01J 37/28 |
| 2021/0202204 A1* | 7/2021 | Mack | G06T 7/40 |
| 2022/0037109 A1* | 2/2022 | Iwatsuka | H01J 37/20 |
| 2022/0059312 A1* | 2/2022 | Kadoi | H01J 37/265 |
| 2022/0187228 A1* | 6/2022 | Oinuma | H01J 37/28 |

FOREIGN PATENT DOCUMENTS

| | | |
|---|---|---|
| JP | H09312246 A | 12/1997 |
| JP | H10334845 A | 12/1998 |
| JP | H11154481 A | 6/1999 |
| JP | 200057985 A | 2/2000 |
| JP | 2000294185 A | 10/2000 |
| JP | 2003197141 A | 7/2003 |
| JP | 2003278825 A | 10/2003 |
| JP | 2007207763 A | 8/2007 |
| JP | 2009212320 A | 9/2009 |
| JP | 2009266453 A | 11/2009 |
| JP | 2010103322 A | 5/2010 |
| JP | 2012015227 A | 1/2012 |
| JP | 2012049045 A | 3/2012 |
| JP | 2012151053 A | 8/2012 |
| JP | 2019220559 A | 12/2019 |
| KR | 10-2013-0110206 A | 10/2013 |
| KR | 10-2019-0045061 A | 5/2019 |

OTHER PUBLICATIONS

Office Action dated Feb. 28, 2023 in Korean Application No. 10-2021-0082068.

* cited by examiner

SHAKE OF ELECTRON BEAM EB1 IN X DIRECTION

SHAKE OF ELECTRON BEAM EB1 IN Y DIRECTION

FREQUENCY SPECTRUM OF HIGH-SPEED MEASUREMENT

FREQUENCY SPECTRUM OF LOW-SPEED MEASUREMENT

FREQUENCY SPECTRUM AT TIMING C

FREQUENCY SPECTRUM AT TIMING D

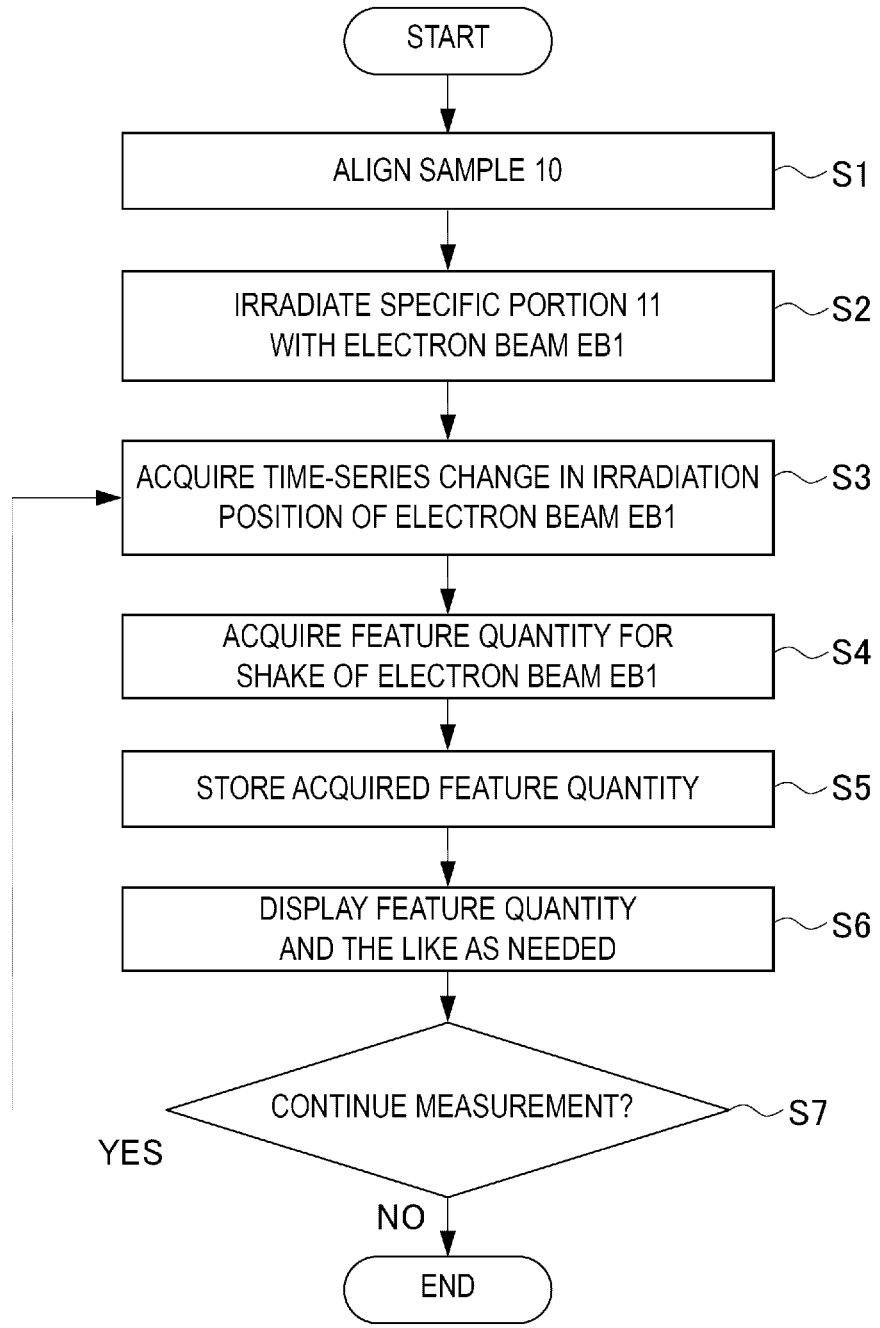

CHARGED PARTICLE BEAM DEVICE AND METHOD OF MEASURING ELECTRICAL NOISE

BACKGROUND OF THE INVENTION

1. Field of the Invention

The present invention relates to a charged particle beam device and a method of measuring electrical noise, in particular, a charged particle beam device that can measure a feature quantity for a shake amount of an electron beam, and a method of measuring electrical noise performed using the charged particle beam device.

2. Description of the Related Art

In recent years, in order to analyze a structure of a sample such as a semiconductor device, a scanning electron microscope (SEM), which is one type of charged particle beam device, is used. In a SEM device, a sample is irradiated and scanned with an electron beam and secondary electrons emitted from a surface of the sample are detected by a detector. The secondary electrons include information on surface irregularities and a material of the sample. An SEM image is formed by converting changes in the energy and number of secondary electrons into luminance values for each irradiated region.

In order to obtain a clear SEM image, it is desirable that electrical noise is not superimposed on an electron beam emitted from an electron source. The electrical noise generated inside and outside the SEM device disturbs an electric field or magnetic field inside a lens barrel through which the electron beam passes, and is superimposed on the electron beam as a shake. As a result, the SEM image shakes and the quality of the SEM image is deteriorated.

In order to reduce the electrical noise that causes the electron beam to shake, it is necessary to identify a noise source, an effective means is to detect the shake of the electron beam and compare a frequency component contained therein with a frequency peak of the noise source.

For example, JP-A-7-65760 (Patent Literature 1) discloses a method in which a boundary between two regions where an emission amount of secondary electrons is significantly different is continuously irradiated with the electron beam scanning with which is stopped, noise from a commercial power supply superimposed on the shake of the electron beam is detected as a change in luminance, and a correction signal is added to the electron beam to cancel the shake of the electron beam.

Further, JP-A-9-312246 (Patent Literature 2) discloses a method in which a shake of a high-frequency electron beam is converted into a low-frequency beat to obtain frequency characteristics of the shake of the electron beam by stopping the scanning of the electron beam on a special pattern and repeating ON/OFF of the electron beam at a high speed.

In addition, JP-A-2012-151053 (Patent Literature 3) discloses a method in which scanning is repeated only in either an X direction or a Y direction on a sample, a deviation amount on each acquired scan result is analyzed so as to obtain frequency characteristics of the shake of the electron beam.

With the miniaturization of semiconductor processes, the shake of the electron beam caused by the above-mentioned electrical noise has a great influence on the deterioration of length measurement accuracy. Therefore, the importance of techniques for detecting and analyzing the shake of electron beam is increasing.

In recent years, a switching power supply has been used in charged particle beam devices, and electrical noise has been increased in frequency to several hundred kHz. However, there is no technique that can measure a minute shake of the electron beam up to a high frequency of several hundred kHz or more. Therefore, when the deterioration of performance such as length measurement accuracy occurs after the device is installed at a customer site, it is difficult to distinguish whether the deterioration is due to changes in high-frequency electrical noise generated inside and outside the device or due to other factors. Therefore, there is a problem that it takes time to take countermeasures and recovery of a function of the device is delayed.

In the above-mentioned Patent Literature 1 and Patent Literature 2, in order to calculate the shake amount of the electron beam, it is necessary to accurately grasp a shape of the electron beam. Further, since a diameter of the electron beam is assumed to be several um, a thin electron beam diameter of a few nm cannot be used in the SEM device.

In the above-mentioned Patent Literature 3, although the electrical noise is measured by repeatedly scanning a specific portion of the sample, high-frequency electrical noise of several hundred kHz or higher cannot be measured due to a shaking-back time of the scanning.

In addition, in Patent Literatures 1 to 3, it is not assumed to measure the electrical noise during in-line operation of the device, and high-speed measurement is also not mentioned.

In this situation, in the charged particle beam device, a technique capable of measuring the high-frequency electrical noise by measuring a minute shake of an electron beam of a high frequency of several hundred kHz or more with high accuracy at a speed according to a situation is desired.

Other technical problems and novel characteristics will be apparent from a description of the description and drawings.

Typical ones of the embodiments disclosed in the present application will be briefly described as follows.

A charged particle beam device according to one embodiment includes an electron source configured to generate an electron beam; a stage on which a sample is to be mounted; a detector configured to detect secondary electrons emitted from the sample; and a control unit electrically connected to the electron source, the stage and the detector and is configured to control the electron source, the stage and the detector. Here, when the sample is mounted on the stage and a specific portion of the sample is continuously irradiated with the electron beam from the electron source, the control unit can calculate a time-series change in irradiation position of the electron beam based on an amount of the secondary electrons emitted from the specific portion, and can calculate a feature quantity for a shake of the electron beam based on the time-series change in irradiation position, and the feature quantity includes a frequency spectrum.

Further, a method of measuring electrical noise according to one embodiment is performed using a charged particle beam device including an electron source configured to generate an electron beam, a stage on which a sample is to be mounted, a detector configured to detect secondary electrons emitted from the sample, a data acquisition unit electrically connected to the detector, a control unit electrically connected to the electron source, the stage, the detector, and the data acquisition unit and configured to control the electron source, the stage, the detector, and the data acquisition unit. The method of measuring electrical noise includes (a) a step of mounting the sample on the stage; (b)

a step of continuously irradiating a specific portion of the sample with the electron beam from the electron source after step (a); (c) a step of detecting, using the detector, the secondary electrons emitted from the specific portion after step (b); (d) a step of measuring an amount of the detected secondary electrons using the data acquisition unit after step (c); (e) a step of calculating, using the control unit, a time-series change in irradiation position of the electron beam based on the amount of secondary electrons after step (d); and (f) a step of calculating, using the control unit, a feature quantity for a shake of the electron beam based on the time-series change in irradiation position after step (e). Here, the feature quantity includes a frequency spectrum.

According to one embodiment, high-frequency electrical noise can be measured in a charged particle beam device.

BRIEF DESCRIPTION OF THE DRAWINGS

FIG. 15 is a flowchart showing a method of measuring electrical noise according to Embodiment 6.

DESCRIPTION OF THE PREFERRED EMBODIMENTS

Figure 1:
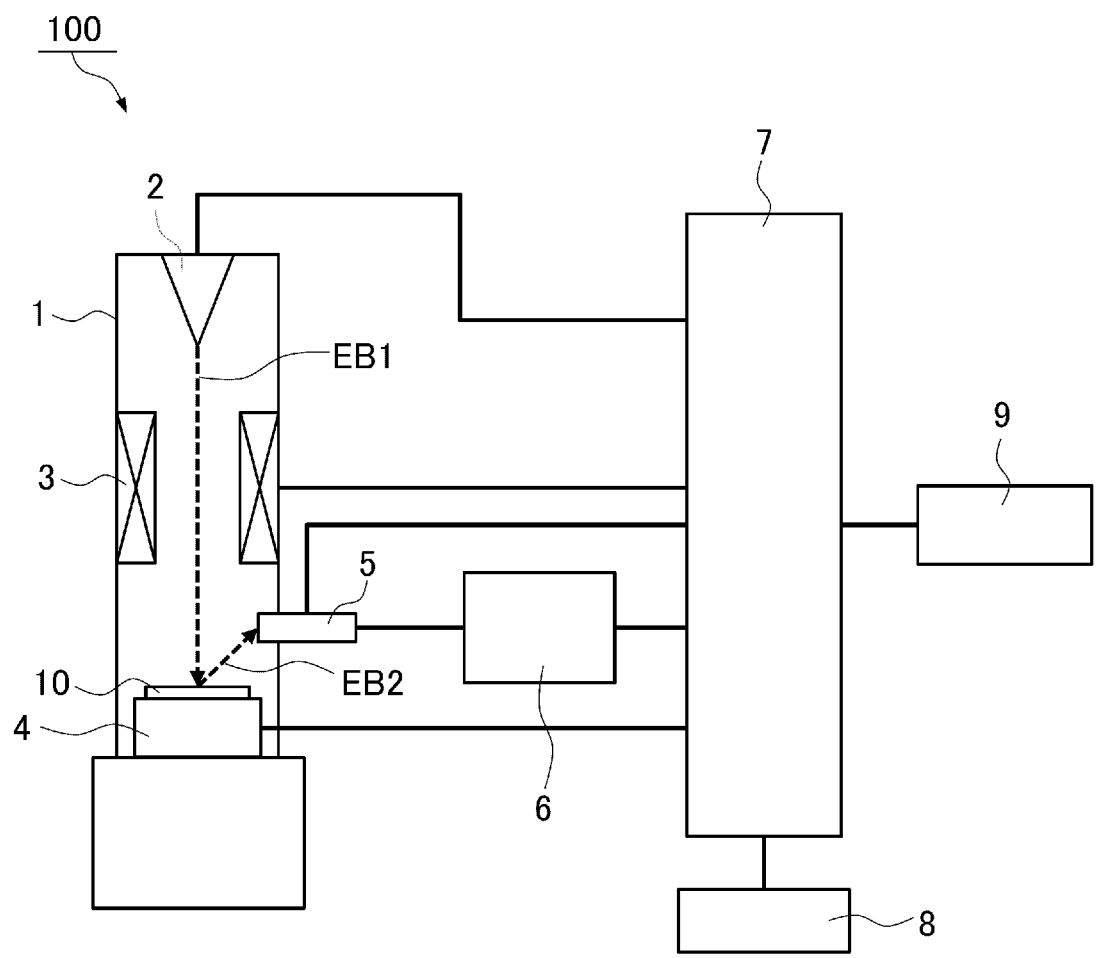
FIG. 1 is a schematic diagram showing a charged particle beam device according to Embodiment 1.

Hereinafter, embodiments will be described in detail with reference to the drawings. In all the drawings for describing the embodiments, members having same functions are denoted by same reference numerals, and repetitive description thereof will be omitted. Further, in the following embodiments, description of the same or similar portion will not be repeated in principle unless necessary.

An X direction, a Y direction, and a Z direction described in the present application are orthogonal to one another. In the present application, the Z direction may be described as an up-down direction, a height direction, or a thickness direction of a certain structure.

Embodiment 1

<Configuration of Charged Particle Beam Device 100>

A charged particle beam device 100 according to Embodiment 1 will be described below with reference to FIG. 1. The charged particle beam device 100 to be described below is a semiconductor inspection device and is a scanning electron microscope (SEM device), and the charged particle beam device 100 may be other devices such as a scanning transmission electron microscope (STEM).

As shown in FIG. 1, the charged particle beam device 100 includes a sample chamber 1, an electron source 2, a deflector 3, a stage 4, a detector 5, a data acquisition unit 6, a control unit 7, a storage unit 8, and a display unit 9. The control unit 7 is electrically connected to the electron source 2, the deflector 3, the stage 4, the detector 5, the data acquisition unit 6, the storage unit 8, and the display unit 9, and can control these units.

When observing a sample 10 to be inspected, an inside of the sample chamber 1 is made to a high degree of vacuum, and the sample 10 is mounted on the stage 4. An electron beam (charged particle beam) EB1 emitted from the electron source (charged particle source) 2 is deflected by the deflector 3 to scan a desired position in the sample 10. The detector 5 is, for example, a secondary electron detector, and detects secondary electrons EB2 emitted from the sample 10 when the sample 10 is irradiated with the electron beam EB1.

The data acquisition unit 6 is electrically connected to the detector 5 and can measure an amount of the detected secondary electrons EB2. Further, the secondary electrons EB2 are sampled by the data acquisition unit 6, and are converted into a signal and then the signal is output to the control unit 7.

The control unit 7 can analyze the received signal and generate an SEM image. An analysis result such as the SEM image or the like is stored in the storage unit 8. Further, the control unit 7 can display the analysis result stored in the storage unit 8 on the display unit 9 as needed.

The control unit 7 according to Embodiment 1 can calculate a time-series change in irradiation position of the electron beam EB1 based on an amount of the secondary electrons EB2 emitted from a specific portion 11 of the sample 10, and can calculate a feature quantity for a shake of the electron beam EB1 based on the time-series change in irradiation position. Such a function will be described below with reference to FIGS. 2 to 4.

Figure 2:
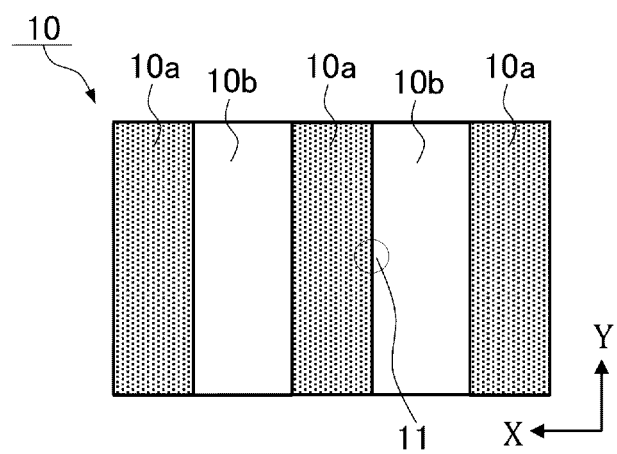
FIG. 2 is a plan view showing a specific portion of a sample according to Embodiment 1.

FIG. 2 is an enlarged plan view of a part of the sample 10. As shown in FIG. 2, the sample 10 includes first regions 10*a* and second regions 10*b* adjacent to the first regions 10*a*. The second region 10*b* is, for example, a region having a height difference from the first region 10*a*.

Here, the first regions 10*a* and the second regions 10*b* form a line and space pattern. The first regions 10*a*, the second regions 10*b*, and boundaries between these regions extend in the Y direction.

The line and space pattern according to Embodiment 1 is a pattern having a height difference in the X direction, and is a pattern in which low regions and high regions are repeatedly arranged. In addition, the low region is a region where a height of an object in the Z direction is relatively low, the high region is a region where the height of the object in the Z direction is relatively high. When the first regions 10a are low regions, the second regions 10b are high regions, and when the second regions 10b are low regions, the first regions 10a are high regions.

Further, the line and space pattern according to Embodiment 1 is not limited to the pattern having a height difference. For example, the second regions 10b may be regions made of a material different from that of the first regions 10a. That is, the first regions 10a and the second regions 10b may be configured to have a difference in luminance between each other. The case where the line and space pattern is a pattern having a height difference will be described below.

The specific portion 11 is a portion continuously irradiated with the electron beam EB1, and includes a first region 10a, a second region 10b, and a boundary between these regions.

Figure 3:
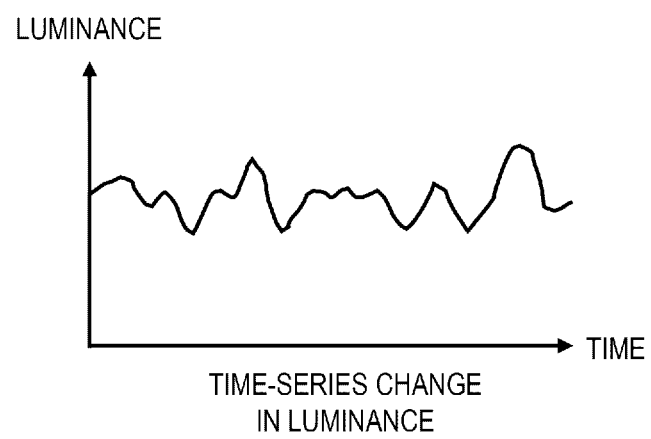
FIG. 3 is a graph showing a time-series change in luminance according to Embodiment 1.

FIG. 3 is a graph showing a time-series change in luminance. Basically, the secondary electrons EB2 are detected by the detector 5, but if the amount of the secondary electrons EB2 is large, the luminance increases, and if the amount of the secondary electrons EB2 is small, the luminance decreases.

The luminance is low in the low regions of the line and space pattern, and is high in the high regions of the line and space pattern. The shake of the electron beam EB1 in the X direction is calculated as a time-series change in luminance by continuously irradiating a vicinity of a boundary between the first regions 10a and the second regions 10b with the electron beam EB1, without performing scanning with the electron beam EB1 by the deflector 3. A large change in luminance at a certain time means that the shake of the electron beam EB1 is large, and that an irradiation position of the electron beam EB1 is deviated. Therefore, the time-series change in irradiation position of the electron beam EB1 can be calculated based on the time-series change in luminance.

That is, when the sample 10 is mounted on the stage 4, and the specific portion 11 of the sample 10 is continuously irradiated with the electron beam EB1 from the electron source 2, the secondary electrons EB2 emitted from the specific portion 11 are detected by the detector 5, and the amount of the detected secondary electrons EB2 is measured by the data acquisition unit 6. Further, the control unit 7 calculates the time-series change in luminance based on the time-series change in amount of the secondary electrons EB2, and calculates the time-series change in irradiation position of the electron beam EB1 based on the time-series change in luminance.

Figure 4:
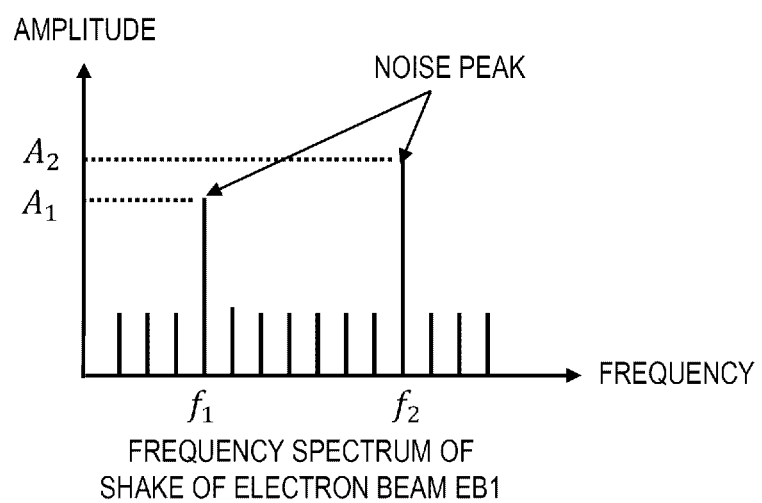
FIG. 4 is a graph showing a frequency spectrum for a shake of an electron beam according to Embodiment 1.

Then, as shown in FIG. 4, when a variation of the luminance is converted into a shake amount of the electron beam EB1 and a frequency analysis such as fast Fourier transform (FFT) is performed, a frequency spectrum for the shake of the electron beam EB1 is obtained. As a result, a frequency component included in the shake of the electron beam EB1 and an amplitude (magnitude of the shake) thereof can be known. In FIG. 4, amplitudes at frequencies f1 and f2 are represented as amplitudes A1 and A2, respectively, which are noise peaks.

In addition, in Embodiment 1, the frequency spectrum for the shake of the electron beam EB1 is defined as a part of the feature quantity of the shake of the electron beam. In other words, the feature quantity includes the frequency spectrum.

<Method of Measuring Electrical Noise>

Figure 5:
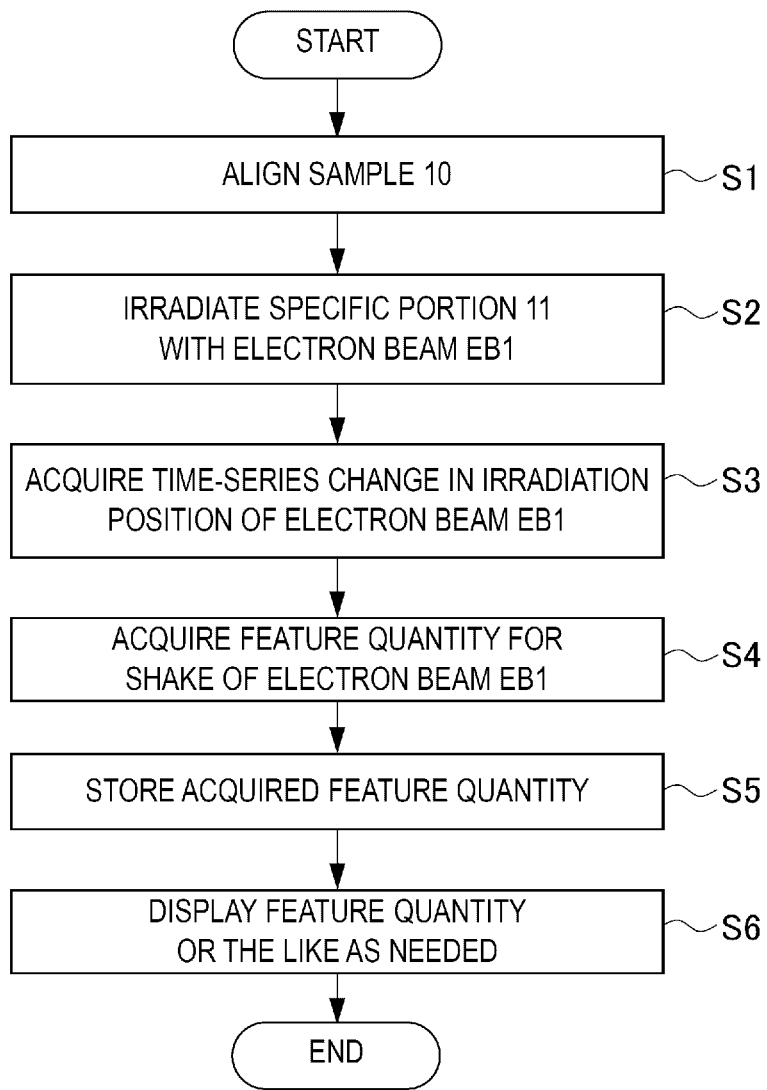
FIG. 5 is a flowchart showing a method of measuring electrical noise according to Embodiment 1.

A method of measuring electrical noise according to Embodiment 1 will be described below with reference to FIG. 5.

In step S1, the sample 10 is aligned. First, the sample 10 is mounted on the stage 4. Next, the electron beam EB1 is focused on the specific portion 11 of the sample 10 by moving the stage 4 or performing scanning using the deflector 3 under the control of the control unit 7.

In step S2, the specific portion 11 is irradiated with the electron beam EB1. Under the control of the control unit 7, the specific portion 11 is continuously irradiated with the electron beam EB1 from the electron source 2 without scanning the sample 10 with the electron beam EB1 using the deflector 3.

In step S3, the time-series change in irradiation position of the electron beam EB1 is acquired. First, the detector 5 detects the secondary electrons EB2 emitted from the specific portion 11. Next, the data acquisition unit 6 measures the amount of the detected secondary electrons EB2. Then, as shown in FIG. 3, the control unit 7 calculates the time-series change in luminance based on the time-series change in amount of the secondary electrons EB2, and calculates the time-series change in irradiation position of the electron beam EB1 based on the time-series change in luminance.

In step S4, the feature quantity of the shake of the electron beam EB1 is acquired. As shown in FIG. 4, the control unit 7 calculates the feature quantity for the shake of the electron beam EB1 based on the time-series change in irradiation position of the electron beam EB1. Further, the feature quantity includes the frequency spectrum.

In step S5, the feature quantity or the like is stored. Under the control of the control unit 7, measurement results (analysis results) such as the time-series change in amount of secondary electrons EB2, the time-series change in luminance, the time-series change in irradiation position of the electron beam EB1 and the feature quantity for the shake of the electron beam EB1 are stored in the storage unit 8.

In step S6, under the control of the control unit 7, the measurement results such as the feature quantity stored in the storage unit 8 are displayed on the display unit 9 as needed.

According to Embodiment 1, the specific portion 11 to be irradiated with the electron beam EB1 is not necessary to have a high contrast, which differs from Patent Literature 1. Further, there is no restriction that the beam diameter of the electron beam EB1 needs to be larger than the shake amount of the electron beam EB1. Further, the shape of the electron beam EB1 is not particularly restricted, but the shape of the electron beam EB1 is preferably as thin as possible, and it is preferable that the electron beam EB1 is focused.

In addition, in Embodiment 1, since the specific portion 11 is continuously irradiated with the electron beam EB1, there is no upper limit on a sampling speed caused by the shaking-back of scanning which is a problem to be solved in Patent Literature 3. Therefore, in Embodiment 1, the measurable frequency can be increased up to the upper limit of the sampling speed of the data acquisition unit 6, and it is possible to deal with high frequency noise of several hundred kHz or more, which has been regarded as a problem in recent years.

As described above, if the charged particle beam device 100 and the method of measuring electrical noise according to Embodiment 1 are used, minute shake of the electron beam EB1 at a high frequency of several hundred kHz or more can be measured with high accuracy and high speed, and a high-frequency electrical noise can be measured.

Further, in Embodiment 1, high-speed electrical noise measurement can be performed by programming a series of steps for measuring electrical noise such as steps S1 to S6 and setting the program in the charged particle beam device 100 as a specification for measuring electrical noise.

In addition, when it is determined that the electron beam EB1 is affected by the high-frequency electrical noise, the shake of the electron beam EB1 can be improved, and the function of the charged particle beam device 100 can be quickly recovered by feeding back the results and taking measures to reduce or eliminate the electrical noise. Therefore, the problem that the quality of the SEM image formed in the charged particle beam device 100 deteriorates can be solved.

Embodiment 2

The charged particle beam device 100 and a method of measuring electrical noise according to Embodiment 2 will be described below with reference to FIGS. 6 to 8 and FIGS. 9A to 9C. In the following description, differences from Embodiment 1 will be mainly described.

Figure 6:
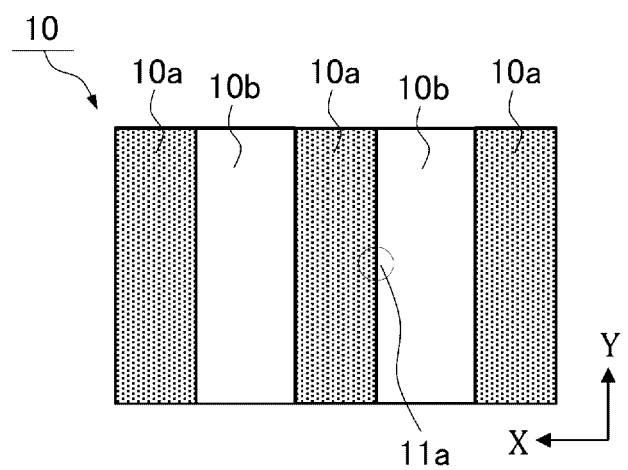
FIG. 6 is a plan view showing a measurement point of a sample according to Embodiment 2.
Figure 7:
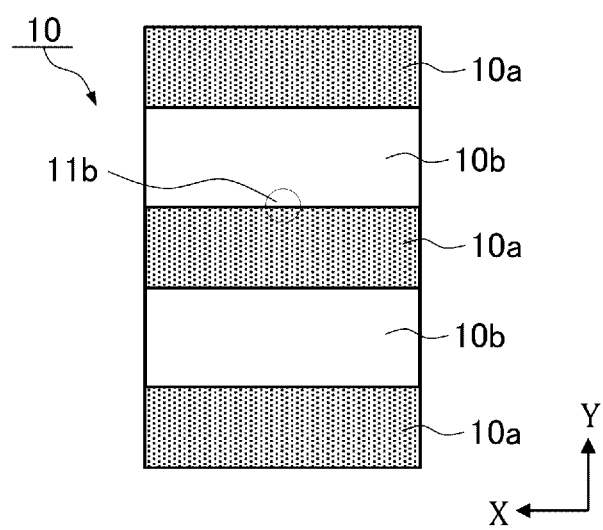
FIG. 7 is a plan view showing a measurement point of the sample according to Embodiment 2.
Figure 8:
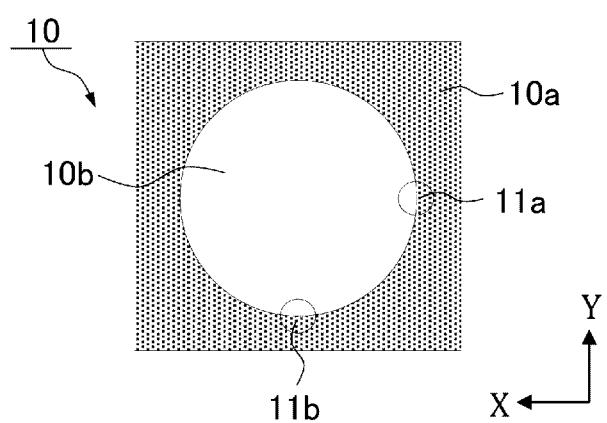
FIG. 8 is a plan view showing measurement points of the sample according to Embodiment 2.

In Embodiment 1, the shake of the electron beam EB1 in one direction such as the X direction is detected, whereas in Embodiment 2, the shake of the electron beam EB1 in a plurality of directions such as the X direction and the Y direction is detected. FIGS. 6 to 8 show different regions of the sample 10.

A line and space pattern shown in FIG. 6 is the same as that of Embodiment 1, the first regions 10a, the second regions 10b, and the boundaries between these regions in FIG. 6 extend in the Y direction.

A line and space pattern shown in FIG. 7 intersects that of FIG. 6, and the first regions 10a, the second regions 10b, and the boundaries between these regions in FIG. 7 extend in the X direction. That is, in FIGS. 6 and 7, the first regions 10a, the second regions 10b and the boundaries between these regions intersect each other and are orthogonal to each other.

In Embodiment 2, the specific portion 11 includes two or more measurement points of the sample 10 that are different from each other. Here, the specific portion 11 of the sample 10 includes the measurement point 11a in FIG. 6 and the measurement point 11b in FIG. 7. The measurement point 11a and the measurement point 11b each include the first region 10a, the second region 10b, and the boundary between these regions.

The shake of the electron beam EB1 in the X direction can be detected by using the measurement point 11a, and the shake of the electron beam EB1 in the Y direction can be detected by using the measurement point 11b. That is, after steps S1 to S6 of FIG. 5 are performed on the measurement point 11a, steps S1 to S6 of FIG. 5 are performed on the measurement point 11b. Further, the measurement point 11b may be subjected to the steps first. In this way, the measurement points 11a and 11b are continuously irradiated with the electron beam EB1, and the feature quantities for the shake of the electron beam EB1 at the measurement point 11a and the measurement point 11b are acquired.

Further, the shake of the electron beam EB1 in the X direction and the Y direction can be detected by using the left and right ends and the upper and lower ends of the circular pattern shown in FIG. 8. Regarding the shake of beam in any direction, after the shake of the electron beam EB1 in the X direction and the Y direction is independently measured, a magnitude and direction of the shake may be calculated using the respective results.

Figure 9A:
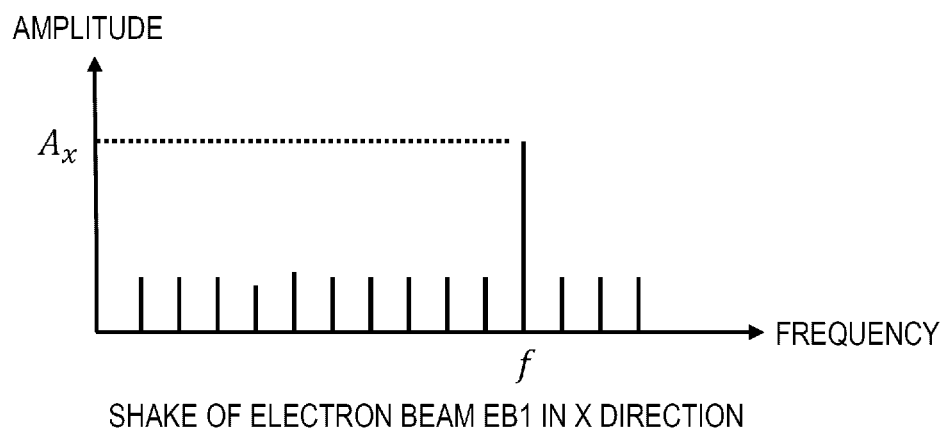
FIG. 9A is a graph showing a frequency spectrum for a shake of an electron beam in an X direction according to Embodiment 2.
Figure 9B:
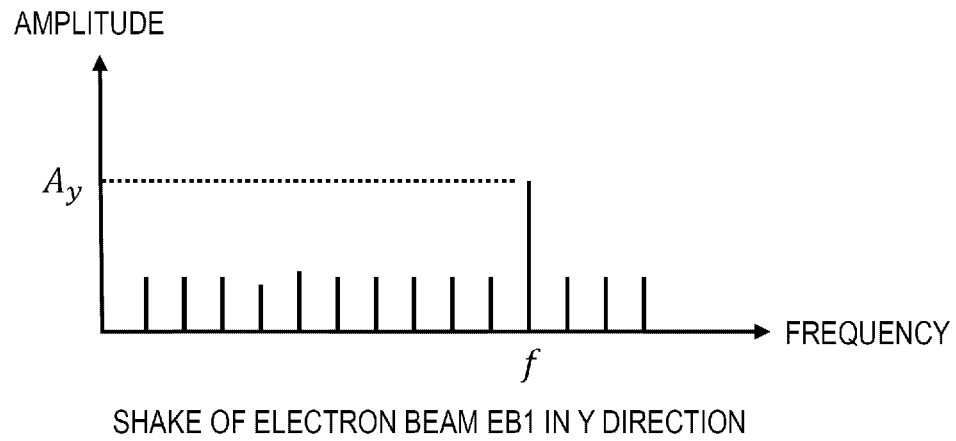
FIG. 9B is a graph showing a frequency spectrum for the shake of the electron beam in a Y direction according to Embodiment 2.
Figure 9C:
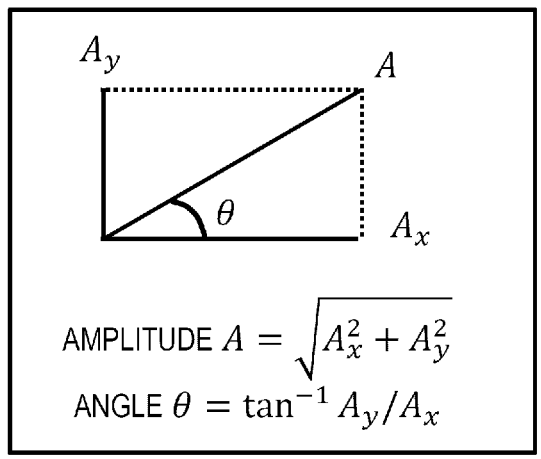
FIG. 9C is a calculation diagram of an amplitude of a shake of the electron beam according to Embodiment 2.

FIGS. 9A to 9C show a method of calculating the magnitude and direction of the shake in any direction. With reference to FIGS. 6 to 8, the electron beams EB1 in the X and Y directions are measured independently, and as a result of frequency analysis, it is assumed that peaks respectively having an amplitude Ax and an amplitude Ay exist at the position of a frequency f. In this case, as shown in FIG. 9C, it can be said that the peak at the frequency f actually oscillates with an amplitude A in a direction inclined by an angle θ from the X axis. The shake of the electron beam EB1 can be detected by using a frequency spectrum at the angle θ and the amplitude A.

Thus, according to Embodiment 2, since the shake of the electron beams EB1 in a plurality of directions can be detected, and thus it is possible to more accurately inspect from which direction the electron beam EB1 is affected by electrical noise.

Embodiment 3

The charged particle beam device 100 and a method of measuring electrical noise according to Embodiment 3 will be described below with reference to FIGS. 10 and 11. In the following description, differences from Embodiment 1 will be mainly described.

Embodiment 3 describes a method in which a method of measuring electrical noise at a high speed and a method of measuring electrical noise at a low speed are separately used according to situations. The charged particle beam device 100 according to Embodiment 3 has a function of separately using measurements related to the shake of the electron beam EB1 as high-speed measurement or low-speed measurement according to situations.

When the specific portion 11 of the sample 10 is fixed in position and is irradiated with the electron beam EB1, the time change of the secondary electrons EB2 is always input to the detector 5, and thus the number of pieces of acquired data can be easily changed by only changing the setting of the data acquisition unit 6 under the control of the control unit 7. For example, in order to reduce the number of pieces of acquired data, it is sufficient to apply not all but only a part of the time-series change in luminance shown in FIG. 3.

That is, the control unit 7 can adjust the number of pieces of acquired data included in the time-series change in luminance, and can adjust the number of pieces of acquired data included in the time-series change in irradiation position of the electron beam EB1. Then, with these adjustments, the control unit 7 can adjust the number of pieces of acquired data included in the feature quantity (frequency spectrum) of the shake of the electron beam EB1.

Figure 10:
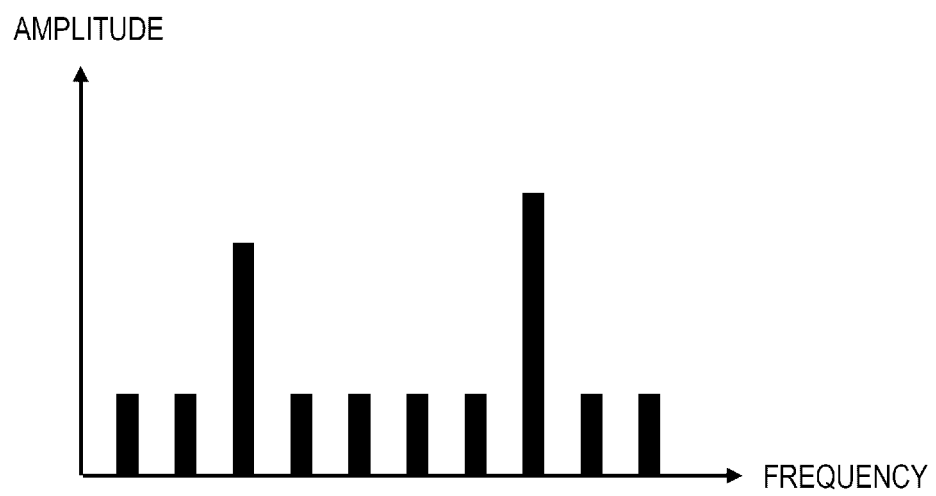
FIG. 10 is a graph showing a frequency spectrum for a shake of an electron beam according to Embodiment 3.

As shown in FIG. 10, when it is desired to grasp a rough feature of the electrical noise, the number of pieces of acquired data is reduced and the high-speed measurement is performed. In this case, the measurement ends at high speed, but the resulting frequency spectrum is coarse.

Such a high-speed measurement is suitable for normal use. At the time of in-line operation of the charged particle beam device 100, for example, an operating status of the charged particle beam device 100 can be monitored by setting the high-speed measurement immediately after autofocus.

Figure 11:
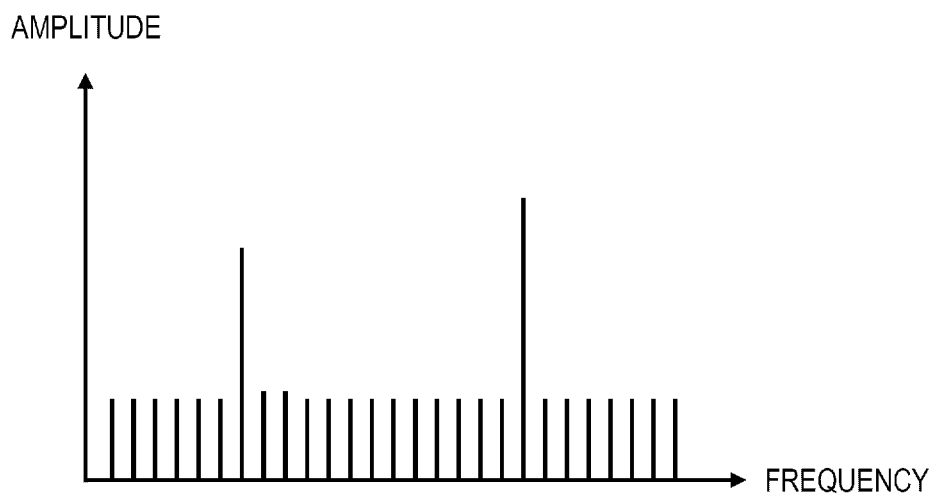
FIG. 11 is a graph showing a frequency spectrum for the shake of the electron beam according to Embodiment 3.

Further, as shown in FIG. 11, when it is desired to grasp a detailed feature of the electrical noise, the number of pieces of acquired data is increased and the low-speed measurement is performed. In this case, the time until the end of measurement increases, but a detailed frequency spectrum can be obtained.

Such a low-speed measurement is suitable when an abnormality occurs and when a regular maintenance is performed in the charged particle beam device 100. By performing the measurement with the increased number of pieces of acquired data, it is possible to grasp the characteristics of electrical noise and source thereof in detail.

In addition, the technique disclosed in Embodiment 3 can also be implemented in combination with the technique disclosed in Embodiment 2.

Embodiment 4

The charged particle beam device 100 and a method of measuring electrical noise according to Embodiment 4 will be described below with reference to FIGS. 12A to 12D and 13. In the following description, differences from Embodiment 1 will be mainly described.

Embodiment 4 describes a method of calculating the feature quantity for the shake of the electron beam EB1 for each predetermined period and monitoring environmental changes inside and outside the device and aging deterioration.

Figure 12A:
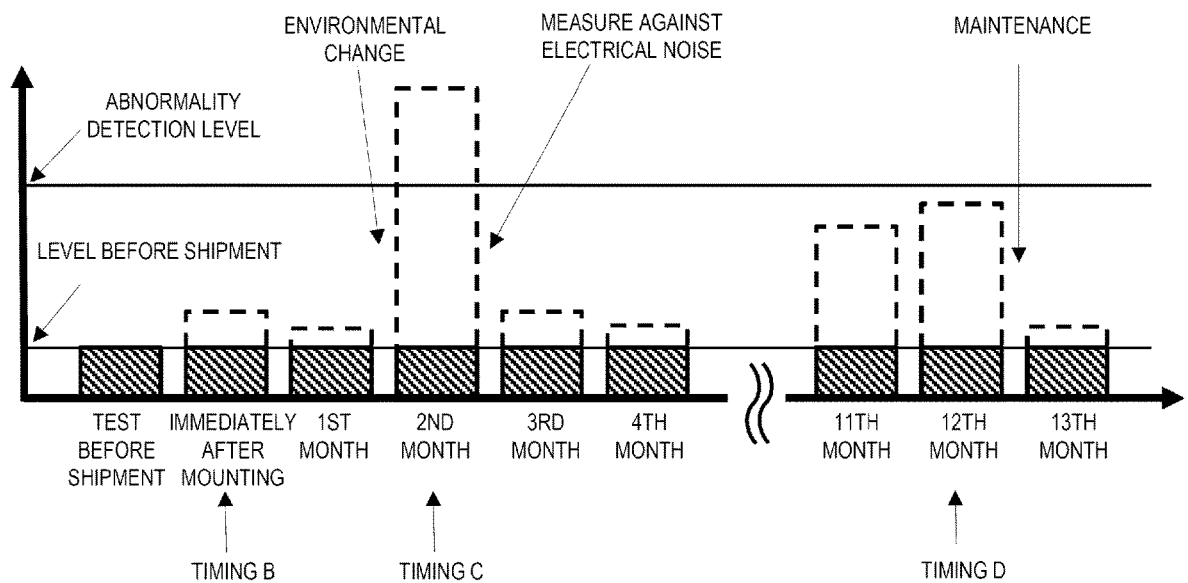
FIG. 12A is a schematic diagram showing monitoring of an increase/decrease in a shake amount of an electron beam due to environmental change and aging deterioration according to Embodiment 4.

FIG. 12A shows monitoring of an increase/decrease in the shake amount of the electron beam due to environmental change and aging deterioration. It is considered that a length measuring performance deteriorates as the shake of the electron beam EB1 increases, as an index on the deterioration of length measurement performance caused by the shake of the electron beam EB1 at the timing of each measurement, intensity of the shake of the electron beam EB1 is defined with, for example, a square-root of sum of squares of all peak values in the frequency spectrum or the like.

Figure 12B:
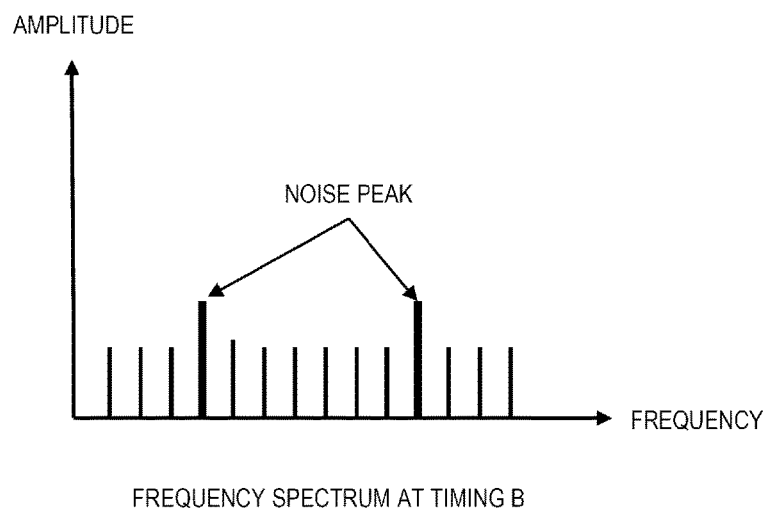
FIG. 12B is a graph showing a frequency spectrum for a shake of an electron beam according to Embodiment 4.
Figure 12C:
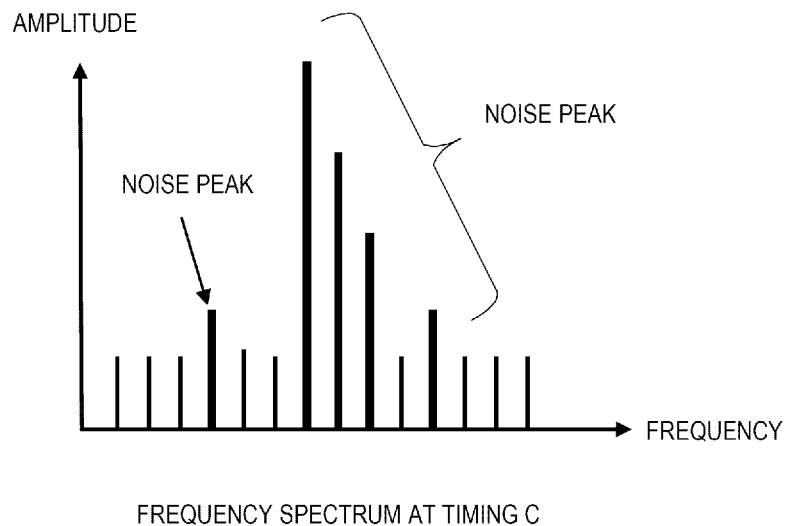
FIG. 12C is a graph showing a frequency spectrum for the shake of the electron beam according to Embodiment 4.
Figure 12D:
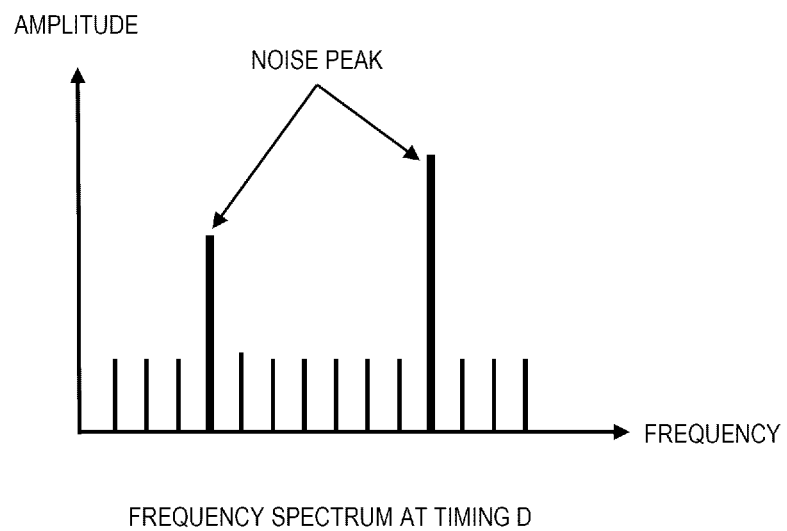
FIG. 12D is a graph showing a frequency spectrum for the shake of the electron beam according to Embodiment 4.

The frequency spectrums at measurement timings B to D shown in FIG. 12A correspond to those in FIGS. 12B to 12D, respectively.

First, the shake of the electron beam EB1 of the charged particle beam device 100 is measured before shipment, and the frequency spectrum as shown in FIG. 12B is stored in the storage unit 8. Then, the intensity of the shake of the electron beam EB1 before shipment is calculated based on the frequency spectrum of the shake of the electron beam EB1 at this time, and this intensity is stored in the storage unit 8.

Next, after the charged particle beam device 100 is mounted, the shake of the electron beam EB1 is measured, for example, every month, the intensity of the shake of the electron beam EB1 is calculated each time, and the intensities are stored in the storage unit 8 together with the frequency spectrum.

By plotting the intensity of the shake of the electron beam EB1 for the timing of each measurement, it is possible to quantitatively grasp the influence of the shake of the electron beam EB1 caused by the environmental change inside and outside the device or the aging deterioration on the deterioration of the length measuring performance.

A broken line shown in FIG. 12A represents the intensity of the shake of the electron beam EB1 at the timing of each measurement. In addition, a hatched region represents the intensity of the shake of the electron beam EB1 before shipment.

In this example, a significant change of surrounding environment occurs at first and second months after the charged particle beam device 100 is mounted, the shake of the electron beam EB1 is extremely increased and exceeds a preset abnormality detection level.

Then, a measure against the electrical noise is performed, and the shake of the electron beam EB1 is stabilized at an original level at the third month. Thereafter, the electrical noise is measured every month, and the maintenance is performed after the measurement at the twelfth month, and the shake of the electron beam EB1 that increased due to the aging deterioration is stabilized to the level immediately after mounting at the thirteenth month.

FIGS. 12B to 12D show respectively measurement results of the electrical noise immediately after the mounting of the charged particle beam device 100, at the second month after the device is mounted, and at the twelfth month after the device is mounted, and thick lines in the frequency spectrum represent noise peaks.

The intensity of the shake of the electron beam EB1 in FIG. 12A is calculated using these peak values of the frequency spectrum. In FIG. 12B, almost no noise peak is found, whereas in FIGS. 12C and 12D, the number and value of noise peak increase.

A customer can predict that the length measuring performance has deteriorated before measuring the length of a wafer in view of FIG. 12A, and thus can quickly perform measure against the electrical noise.

In addition, a person in charge of the maintenance can immediately specify an electrical noise source by observing the shake of the electron beam EB1 in FIGS. 12B to 12D and then recording a position where the peak appears, and confirming the electrical noise source and the frequency of the electrical noise.

Figure 13:
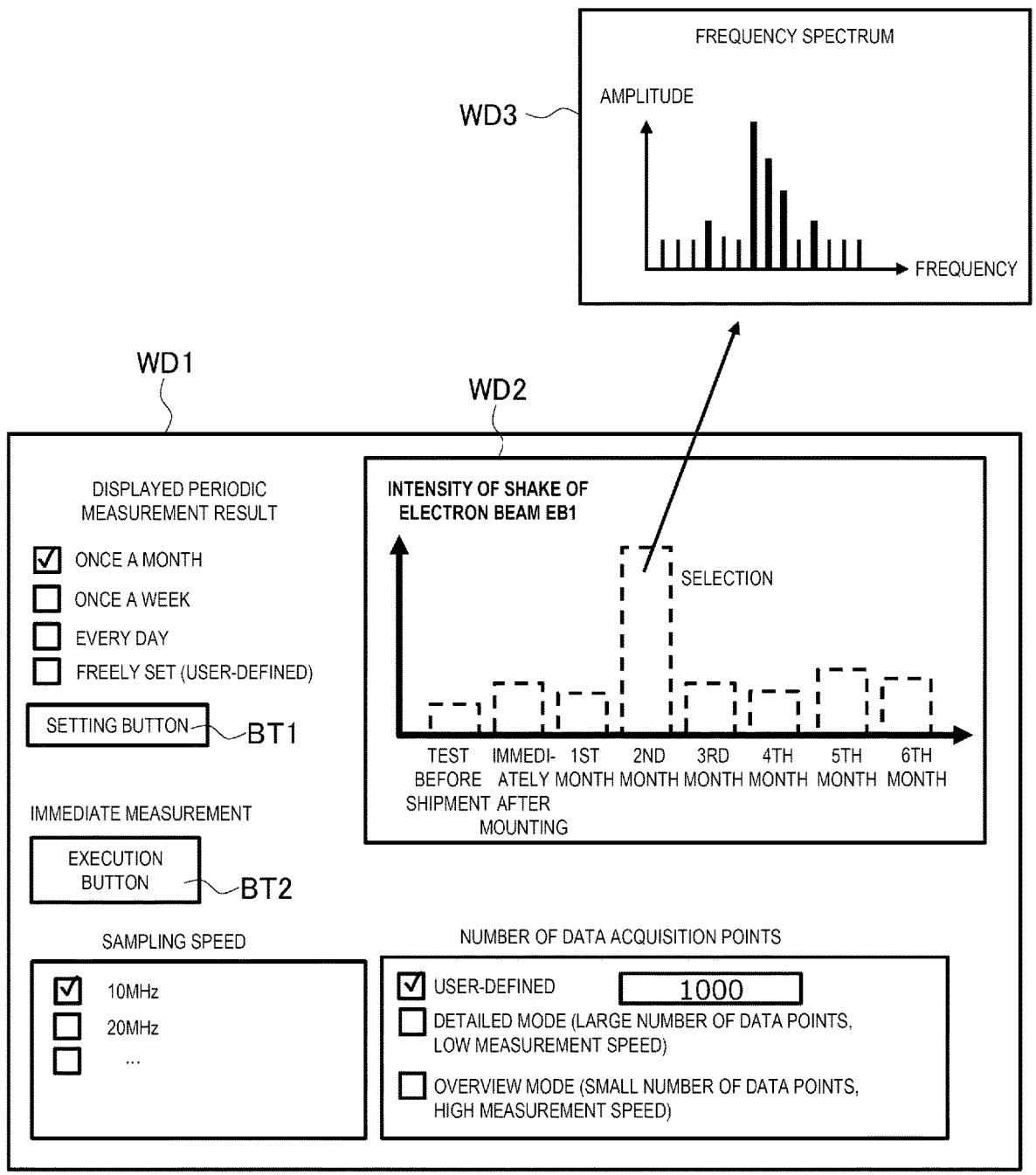
FIG. 13 is a schematic diagram showing a GUI according to Embodiment 4.

FIG. 13 is an example of a GUI that displays periodic measurement results of the electrical noise. As described with reference to FIGS. 12A to 12D, in order to calculate the feature quantity (the frequency spectrum) of the shake of the electron beam EB1, steps S1 to S6 shown in FIG. 3 are performed for each predetermined period, and the results are stored in the storage unit 8. The control unit 7 can display the feature quantities stored in the storage unit 8 for each predetermined period on a window WD3 of the display unit 9 as shown in FIG. 13.

Various items are displayed in a window WD1. Check boxes for setting an interval of time axis data to once a month, once a week, every day, and freely setting (user-defined) are displayed at an upper left of the window WD1. If a user checks any of the checkboxes, a window WD2 showing the intensity of the shake of the electron beam EB1 for each measurement timing is displayed at an upper right of the window WD1.

The measurement timing, the sampling speed, and the number of acquired data points can be changed by the user pressing a setting button BT1 provided in the window WD1. When the user selects one form the intensities of the shake of the electron beam EB1 displayed in the window WD2, the feature quantity (the frequency spectrum) at that time is displayed as in the window WD3.

Further, when it is desired to measure the electrical noise immediately, the user sets the sampling speed and the number of data acquisition points and presses an execution button BT2 for immediate measurement provided in the window WD1, thus the measurement of electrical noise is executed, and the frequency spectrum is displayed in the window WD3.

By monitoring how the shake of the electron beam EB1, which is one of factors on the performance deterioration of the charged particle beam device 100, changes according to the environment around the device or with the passage of time, the result is fed back, and the function of the charged particle beam device 100 is quickly recovered. As a result, high performance of the charged particle beam device 100 can be maintained, and performance differences between a plurality of charged particle beam devices 100 can be reduced.

In addition, the technique disclosed in Embodiment 4 can also be implemented in combination with the techniques disclosed in Embodiments 2 and 3.

Embodiment 5

The charged particle beam device 100 and a method of measuring electrical noise according to Embodiment 5 will be described below with reference to FIG. 14. In the following description, differences from Embodiment 1 will be mainly described.

Embodiment 5 describes a method of aggregating measurement results from a plurality of charged particle beam devices.

Figure 14:
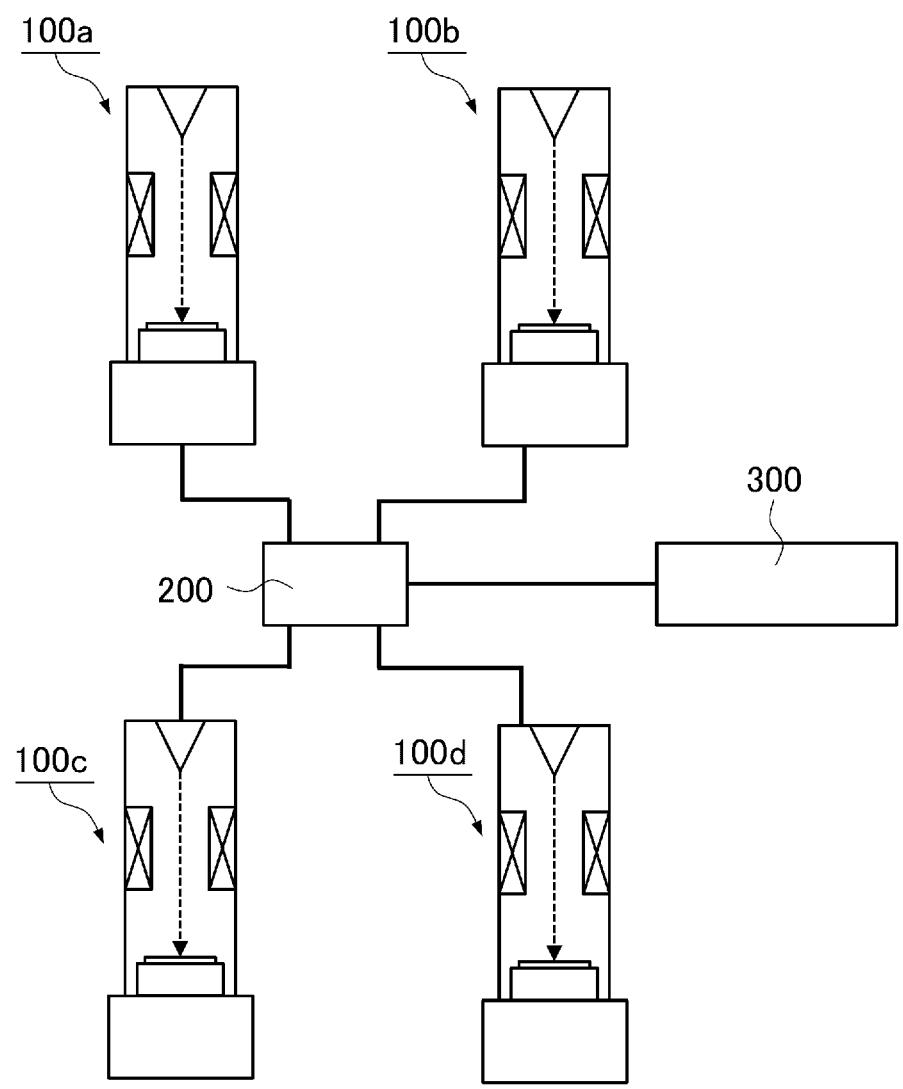
FIG. 14 is a schematic diagram showing a management system according to Embodiment 5.

As shown in FIG. 14, a plurality of the charged particle beam devices 100a to 100d are electrically connected to a management device 300 via a server 200. The charged particle beam devices 100a to 100d are devices equivalent to the charged particle beam device 100 according to Embodiment 1.

The operating status of each of the charged particle beam devices 100a to 100d, the measurement result of electrical noise, and the time point when the data is acquired, and the like are uploaded to the management device 300 from the control unit 7 of each of the charged particle beam devices 100a to 100d.

By confirming the data stored in the management device 300, it is possible to infer where the electrical noise source that causes the shake of the electron beam EB1 is from the relation between the measurement results of the electrical noise of the charged particle beam devices 100a to 100d and locations where the charged particle beam devices 100a to 100d are mounted, so that a clue to improve the functions of the charged particle beam devices 100a to 100d can be obtained.

In addition, the technique disclosed in Embodiment 5 can also be implemented in combination with the techniques disclosed in Embodiments 2 to 4.

Embodiment 6

The charged particle beam device 100 and a method of measuring electrical noise according to Embodiment 6 will be described below with reference to FIG. 15. In the following description, differences from Embodiment 1 will be mainly described.

Embodiment 6 describes a method of measuring electrical noise in real time. Since the method of measuring electrical noise disclosed in Embodiment 1 and the like can be executed at high speed, electrical noise can be measured in real time by putting one measurement in a loop and repeating the measurement many times. The method is useful for a person in charge of the maintenance to eliminate the shake of the beam generated in the device.

FIG. 15 is a flowchart showing the method of measuring electrical noise. Steps S1 to S6 are the same as those described in FIG. 3. Thereafter, in step S7, it is determined whether to continue the measurement. When it is determined to continue the measurement, the measurement returns to step S3, and steps S3 to S6 are repeated at least once. In this case, the same specific portion 11 is continuously irradiated with the electron beam EB1, and the shake of the electron beam EB1 with respect to the same specific portion 11 is continuously displayed on the display unit 9 in real time. When it is determined in step S7 that the measurement is not continued, the control unit 7 stops the irradiation of the electron beam EB1 and ends the measurement.

In addition, the technique disclosed in Embodiment 6 can also be can be implemented in combination with the techniques disclosed in Embodiments 2 to 5.

Although the present invention has been described in detail based on the above embodiments as described above, the present invention is not limited to the above embodiments, and various modifications can be made without departing from the scope of the present invention.

For example, it is possible to replace a part of a configuration of one embodiment with a configuration of another embodiment. The configuration of one embodiment can be added to the configuration of another embodiment. In addition, the above configurations, functions, processing units, processing means, or the like may be implemented by hardware by designing a part or all of them with, for example, an integrated circuit. The above configurations, functions, or the like may also be implemented by software by means of interpreting and performing a program, by a processor, for realizing respective functions. Information such as a program, a table, and a file for realizing each function can be stored in a recording device such as a memory, a hard disk, or a solid state drive (SSD), or in a recording medium such as an IC card, an SD card, or a DVD.

What is claimed is:

1. A charged particle beam device, comprising:
an electron source configured to generate an electron beam;
a stage on which a sample is to be mounted;
a detector configured to detect secondary electrons emitted from the sample; and
a processor electrically connected to the electron source, the stage and the detector, and configured to control the electron source, the stage and the detector, wherein
the processor is further configured to continuously irradiate the sample mounted on the stage such that a specific portion of the sample is continuously irradiated with the electron beam from the electron source, and to calculate a time-series change in irradiation position of the electron beam based on an amount of the secondary electrons emitted from the specific portion, and to calculate a feature quantity for shake of the electron beam based on the time-series change in irradiation position, and
the feature quantity includes a frequency spectrum.

2. The charged particle beam device according to claim 1, wherein
the processor is further configured to calculate a time-series change in luminance based on a time-series change in amount of the secondary electrons, and calculate a time-series change in irradiation position based on the time-series change in luminance.

3. The charged particle beam device according to claim 1, wherein
the processor is configured to adjust the number of pieces of acquired data included in the time-series change in irradiation position.

4. The charged particle beam device according to claim 1, wherein
the processor is further configured to control the electron source to continuously irradiate the specific portion of the sample with the electron beam such that the specific portion irradiated by the electron beam includes a first region of the sample, a second region of the sample which is adjacent to the first region, and a boundary between the first region and the second region, wherein the second region is a region having a height that is different from a height of the first region, or the second region is a region made of a material different from a material of the first region.

5. The charged particle beam device according to claim 4, wherein the processor is further configured to control the electron source to continuously irradiate the specific portion of the sample with the electron beam such that the specific portion irradiated by the electron beam includes two or more measurement points of the sample that are different from each other.

6. The charged particle beam device according to claim 5, wherein the processor is further configured
to control the electron source to continuously irradiate the specific portion of the sample with the electron beam such that the first region, the second region, and a boundary at a first measurement point of the specific portion extend in a first direction; and
to control the electron source to continuously irradiate the specific portion of the sample with the electron beam such that the first region, the second region, and the boundary at a second measurement point of the specific portion are different from the first region, the second region, and a boundary at the first measurement point of the specific portion,
wherein the first region, the second region, and the boundary at the second measurement point of the specific portion extend in a second direction intersecting the first direction.

7. The charged particle beam device according to claim 1, further comprising:

a memory and a display that are electrically connected to the processor, wherein
the processor is further configured to calculate the feature quantity for each predetermined period, to store, in the memory, the calculated feature quantity for each predetermined period, and to output to the display the feature quantity for each predetermined period stored in the memory.

8. A method of measuring electrical noise using a charged particle beam device, the method comprising:

(a) a step of mounting a sample on a stage of the charged particle beam device;
(b) a step of continuously irradiating a specific portion of the sample with an electron beam from an electron source after step (a);
(c) a step of detecting, using a detector, secondary electrons emitted from the specific portion after step (b);
(d) a step of measuring an amount of the detected secondary electrons after step (c);
(e) a step of calculating a time-series change in irradiation position of the electron beam based on the measured amount of detected secondary electrons after step (d); and
(f) a step of calculating a feature quantity for a shake of the electron beam based on the calculated time-series change in irradiation position after step (e), wherein the calculated feature quantity includes a frequency spectrum.

9. The method of measuring electrical noise according to claim 8, wherein step (e) further comprises calculating a time-series change in luminance based on a time-series change in the measured amount of the secondary electrons, and calculating a time-series change in irradiation position based on the calculated time-series change in luminance.

10. The method of measuring electrical noise according to claim 8, further comprising adjusting a number of pieces of acquired data included in the calculated time-series change in irradiation position.

11. The method of measuring electrical noise according to claim 8, further comprising:
controlling the electron source to continuously irradiate the specific portion of the sample with the electron beam such that the specific portion irradiated by the electron beam includes a first region of the sample, a second region of the sample which is adjacent to the first region, and a boundary between the first region and the second region,
wherein the second region is a region having a height that is different from a height of the first region, or the second region is a region made of a material different from a material of the first region.

12. The method of measuring electrical noise according to claim 11, further comprising controlling the electron source to continuously irradiate the specific portion of the sample with the electron beam such that the specific portion irradiated by the electron beam in the step (b) includes two or more measurement points of the sample that are different from each other.

13. The method of measuring electrical noise according to claim 12, further comprising:

controlling the electron source to continuously irradiate the specific portion of the sample with the electron beam such that the boundary at a first measurement point of the specific portion extends in a first direction; and
controlling the electron source to continuously irradiate the specific portion of the sample with the electron beam such that the boundary at a second measurement point of the specific portion is different from the boundary at the first measurement point of the specific portion,
wherein the boundary at the second measurement point of the specific portion extends in a second direction intersecting the first direction.

14. The method of measuring electrical noise according to claim 8, further comprising:

(g) a step of storing the calculated feature quantity in memory after step (f);
performing steps (a) to (g) for each predetermined period; and
outputting to a display the feature quantity for each predetermined period stored in the memory.

15. The method of measuring electrical noise according to claim 8, further comprising:

(g) a step of storing the calculated feature quantity in a memory after step (f);
(h) a step of outputting the calculated feature quantity to a display after step (g); and
(i) a step of repeating steps (c) to (h) one or more times after step (h).

16. A non-transitory computer-readable medium upon which is embodied programmed instructions which, when executed by a processor, cause the processor to perform operations for measuring electrical noise using a charged particle beam device, the operations comprising:

(a) a step of continuously irradiating a specific portion of a sample mounted on a stage of the charged particle beam device, with an electron beam from an electron source;

(b) a step of detecting, using a detector, secondary electrons emitted from the specific portion after step (a);

(c) a step of measuring an amount of the detected secondary electrons after step (b);

(d) a step of calculating a time-series change in irradiation position of the electron beam based on the measured amount of detected secondary electrons after step (c); and (e) a step of calculating a feature quantity for a shake of the electron beam based on the calculated time-series change in irradiation position after step (d), wherein the calculated feature quantity includes a frequency spectrum.

17. The non-transitory computer-readable medium according to claim 16, wherein step (d) further comprises calculating a time-series change in luminance based on a time-series change in the measured amount of the secondary electrons, and calculate a time-series change in irradiation position based on the calculated time-series change in luminance.

18. The non-transitory computer-readable medium according to claim 16, wherein the operations further comprise:

controlling the electron source to continuously irradiate the specific portion of the sample with the electron beam such that the specific portion irradiated by the electron beam includes a first region of the sample, a second region of the sample which is adjacent to the first region, and a boundary between the first region and the second region;

controlling the electron source to continuously irradiate the specific portion of the sample with the electron beam such that the specific portion irradiated by the electron beam in the step (a) includes two or more measurement points of the sample that are different from each other;

controlling the electron source to continuously irradiate the specific portion of the sample with the electron beam such that the boundary at a first measurement point of the specific portion extends in a first direction; and controlling the electron source to continuously irradiate the specific portion of the sample with the electron beam such that the boundary at a second measurement point of the specific portion is different from the boundary at the first measurement point of the specific portion, wherein the second region is a region having a height that is different from a height of the first region, or the second region is a region made of a material different from a material of the first region, and wherein the boundary at the second measurement point of the specific portion extends in a second direction intersecting the first direction.

19. The non-transitory computer-readable medium according to claim 16, further comprising:

(f) a step of storing the calculated feature quantity in memory after step (e);

performing steps (a) to (f) for each predetermined period; and outputting to a display the feature quantity for each predetermined period stored in the memory.

20. The non-transitory computer-readable medium according to claim 16, further comprising:

(f) a step of storing the calculated feature quantity in a memory after step (e);

(g) a step of outputting the calculated feature quantity to a display after step (f); and (h) a step of repeating steps (b) to (g) one or more times after step (g).

* * * * *